(12) United States Patent
Cheng et al.

(10) Patent No.: US 7,817,051 B2
(45) Date of Patent: *Oct. 19, 2010

(54) POWER CONVERTER WITH DEGRADED COMPONENT ALARM

(75) Inventors: Wing Ling Cheng, Taipo (HK); Zhe Wang, Shenzhen (CN); Huai Gang Jiang, Shenzhen (CN); Lin Guo Wang, Nanjing (CN)

(73) Assignee: Astec International Limited, Kwun Tong, Kowloon (HK)

( * ) Notice: Subject to any disclaimer, the term of this patent is extended or adjusted under 35 U.S.C. 154(b) by 263 days.

This patent is subject to a terminal disclaimer.

(21) Appl. No.: 11/901,260

(22) Filed: Sep. 14, 2007

(65) Prior Publication Data

US 2009/0072983 A1 Mar. 19, 2009

(51) Int. Cl.
*G08B 21/00* (2006.01)
(52) U.S. Cl. .............. 340/635; 340/653; 324/519; 324/548
(58) Field of Classification Search .......... 340/635, 340/653, 654, 657, 660, 3.34; 363/74, 76; 324/519, 522, 548
See application file for complete search history.

(56) References Cited

U.S. PATENT DOCUMENTS

| | | | |
|---|---|---|---|
| 3,458,795 A | 7/1969 | Ainsworth | |
| 4,896,089 A | 1/1990 | Kliman et al. | |
| 5,455,736 A | 10/1995 | Nishiyama et al. | |
| 5,561,610 A | 10/1996 | Schricker et al. | |
| 5,656,765 A | 8/1997 | Gray | |
| 5,786,641 A | 7/1998 | Nakanishi et al. | |
| 5,950,147 A | 9/1999 | Sarangapani et al. | |
| 6,119,074 A | 9/2000 | Sarangapani | |
| 6,121,886 A | 9/2000 | Andersen | |
| 6,157,897 A | 12/2000 | Yoshikawa | 702/132 |
| 6,275,161 B1 * | 8/2001 | Wan et al. | 340/636.15 |
| 6,275,958 B1 | 8/2001 | Carpenter et al. | |
| 6,363,332 B1 | 3/2002 | Rangarajan et al. | |
| 6,424,930 B1 | 7/2002 | Wood | |
| 6,437,963 B1 | 8/2002 | Hamilton et al. | |
| 6,487,463 B1 | 11/2002 | Stepp, III | 700/79 |
| 6,807,507 B2 | 10/2004 | Kumar et al. | |
| 6,880,967 B2 | 4/2005 | Isozumi et al. | |
| 7,003,409 B2 | 2/2006 | Hepner et al. | |
| 7,016,825 B1 | 3/2006 | Tryon, III | |
| 7,050,396 B1 | 5/2006 | Cohen et al. | |

(Continued)

FOREIGN PATENT DOCUMENTS

JP    2007057402 A    3/2007

OTHER PUBLICATIONS

"Influence of aging on electrolytic capacitors function in static converters: Fault prediction method," P. Venet, A. Lahyani, G. Grellet and A. Ah-Jaco; The European Physical Journal 1999; pp. 71-83.

*Primary Examiner*—Toan N Pham
(74) *Attorney, Agent, or Firm*—Harness, Dickey & Pierce, P.L.C.

(57) ABSTRACT

A power converter including a processor, at least one component whose health in the power converter will degrade over time, and at least one alarm is disclosed. The processor is configured for monitoring the health of the component over time, and for activating the alarm when the monitored health of the component reaches a threshold level.

21 Claims, 12 Drawing Sheets

U.S. PATENT DOCUMENTS

| | | |
|---|---|---|
| 7,254,514 B2 | 8/2007 | House et al. |
| 7,355,362 B2 * | 4/2008 | Pai et al. .................... 318/432 |
| 7,424,396 B2 | 9/2008 | Dodeja et al. |
| 7,456,618 B2 | 11/2008 | Jain et al. |
| 2005/0030772 A1 | 2/2005 | Phadke |
| 2005/0219883 A1 | 10/2005 | Maple et al. |
| 2006/0273595 A1 | 12/2006 | Avagliano et al. |
| 2007/0103163 A1 | 5/2007 | Hachisuka et al. |
| 2008/0141072 A1 | 6/2008 | Kalgren et al. |
| 2008/0157742 A1 | 7/2008 | Martin et al. |
| 2008/0215294 A1 | 9/2008 | Rosner et al. |
| 2009/0072984 A1 * | 3/2009 | Cheng et al. ................ 340/653 |

* cited by examiner

POWER CONVERTER WITH DEGRADED COMPONENT ALARM

FIELD

The present disclosure relates to power converters including AC/DC and DC/DC power converters.

BACKGROUND

The statements in this section merely provide background information related to the present disclosure and may not constitute prior art.

A wide variety of power converters are known in the art for converting electric power from one form to another, including AC/DC and DC/DC power converters. These power converters commonly include one or more controllers that, among other things, monitor critical parameters such as input current, output current and/or temperature. When an overcurrent or over-temperature condition is detected, the controller can generate a fault signal and/or shutdown the power converter to prevent or minimize damage to the power converter and any system hosting the power converter (e.g., a computer or automotive system). Although these known approaches are useful for detecting faults, the present inventors have recognized a need for further improvements in power supply fault detection.

SUMMARY

According to one aspect of the present disclosure, a power converter includes a processor, at least one component whose health in the power converter will degrade over time, and at least one alarm. The processor is configured for monitoring the health of the component over time, and for activating the alarm when the monitored health of the component reaches a threshold level Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application, or uses.

Figure 1:
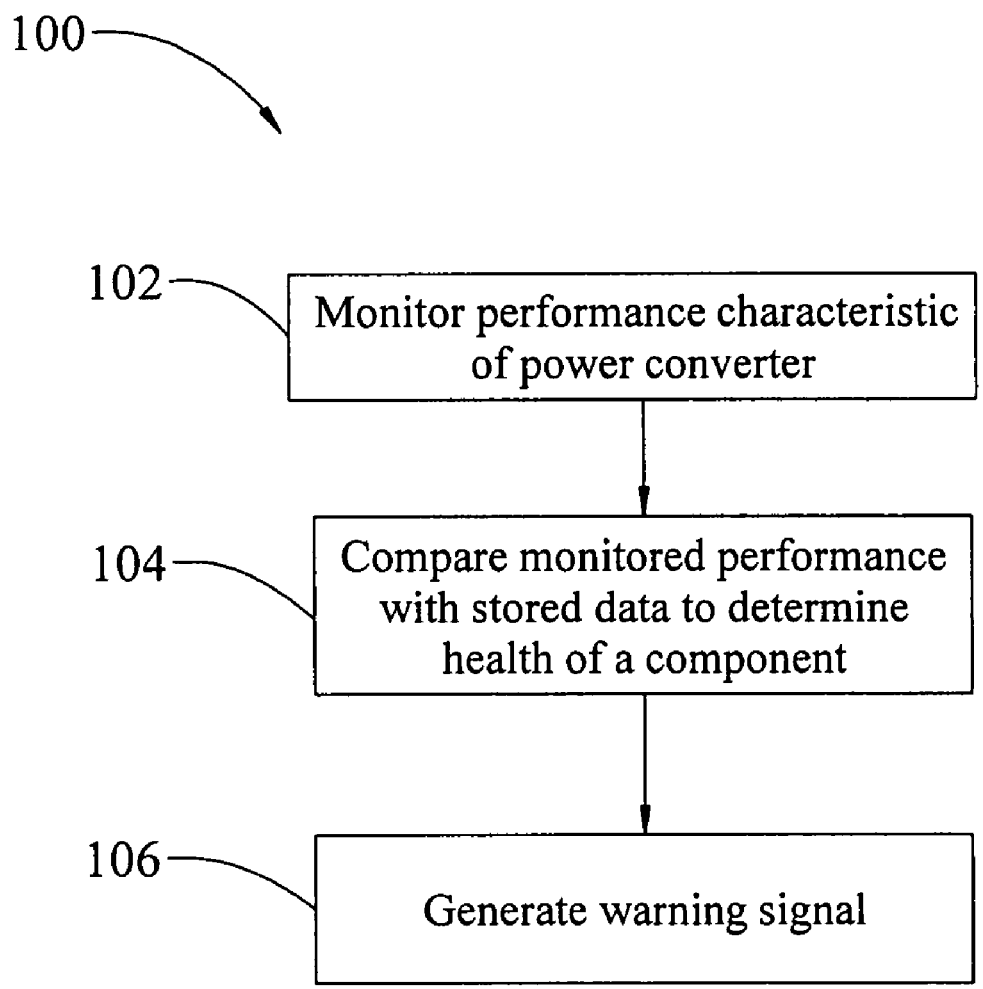
FIG. 1 is a flow diagram of a method of monitoring a performance characteristic of a power converter to determine the health of a component in the power converter.

A method for monitoring the health of at least one component in a power converter according to one aspect of the present disclosure is illustrated in FIG. 1 and indicated generally by reference number 100. As shown in FIG. 1, the method 100 includes, at 102, monitoring at least one performance characteristic of the power converter which relates to the health of the component. At 104, the monitored performance characteristic is compared with stored data to determine whether the health of the component has reached a predetermined level. At 106, a warning signal is generated after determining the health of the component has reached the predetermined level. In this manner, a degradation in the health of one or more power supply components can be detected and reported so as to permit timely service (ranging from minor maintenance to replacement) of such component(s) prior to a complete failure of the component(s) and/or the power converter. These teachings can be applied to AC/DC and DC/DC power converters, including switch-mode power supplies.

In some embodiments, the health of multiple components of a power converter are monitored. Preferably, each monitored component is associated with a unique warning signal that is generated when the health of that component has degraded to a predetermined level. In this manner, the generated warning signal identifies the particular component in need of service or replacement. Alternatively, the same warning signal can be generated when the health of any one of the components has degraded to a particular level.

Further, in some embodiments, one or more alarms are provided and activated by the generated warning signal(s) so as to provide a visual and/or audible warning when a component is in need of service. Additionally, or in the alternative, the generated warning signal(s) can be provided to a load supplied by the power converter, including to a processor in a system hosting the power converter (such as a computer server). The power converter can also be configured to shut down after generating a particular warning signal.

With further reference to the method 100 of FIG. 1, the particular component whose health is monitored can be, for example, a capacitor, a fan or any other critical performance component of the power converter. In the case of an electrolytic capacitor, the ripple voltage across the capacitor can be used to represent the health of the capacitor, and can therefore be monitored to determine whether the health of the capacitor has degraded to a particular level. In particular, as the electrolyte of a capacitor decreases gradually over time, the effective series resistance of the capacitor increases and its capacitance decreases, which leads to greater and greater ripple voltage. Accordingly, ripple voltage can be used as an indicator of the capacitor's health. In the case of a fan, the fan speed for a given load, control input and/or temperature condition can be used to represent the health of the fan. Thus, the health of a power converter fan can be monitored by monitoring, e.g., fan speed, fan speed commands, temperature and/or output current level.

Figure 2:
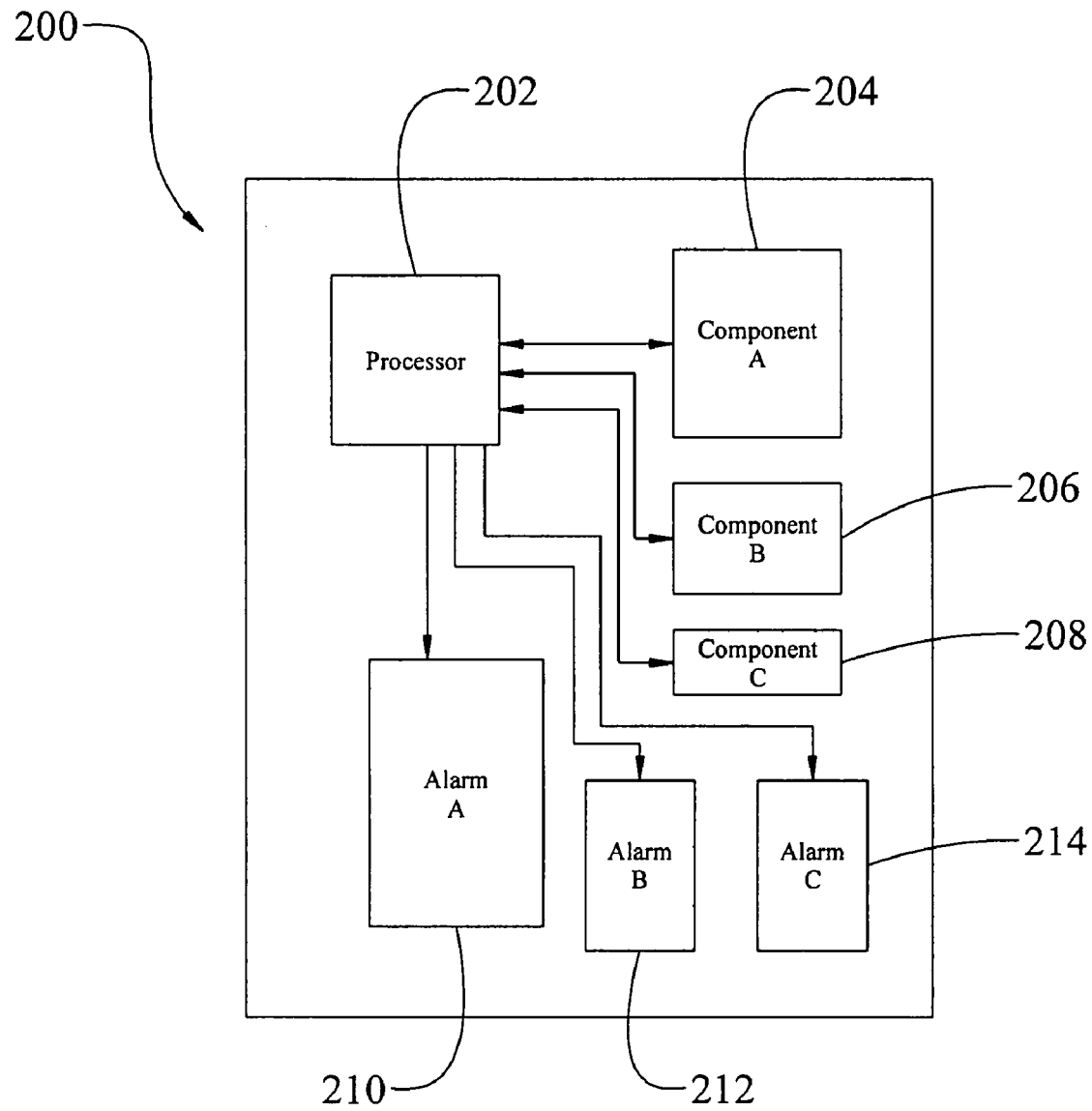
FIG. 2 is a block diagram of a power converter configured to monitor the health of one or more components in the power converter.

FIG. 2 illustrates a power converter 200 according to one embodiment of the present disclosure. The power converter 200 includes a processor 202 and various components 204, 206, 208 whose performance in the power converter will degrade over time (e.g., due to wear out, decay, thermal cycling, etc.). The power converter 200 further includes alarms 210, 212, 214. The processor 202 is configured to monitor the health of the components 204, 206, 208 over time. When the monitored performance of any of these components reaches a threshold level, the processor 202 activates the corresponding alarm 204, 206 or 208. In the specific embodiment of FIG. 2, each monitored component 204, 206, 208 is associated with a different alarm 210, 212, 214, respectively. In this manner, a user can readily determine which component is in need of service based on which alarm is activated.

The alarms shown in FIG. 2 can be visual alarms and/or audible alarms. In the case of visual alarms, one or more lights (including light emitting diodes (LEDs)) can be employed, as can display devices for displaying text or other messages (e.g., icons), etc. If the alarm includes one or more lights, activating the alarm can include turning it on, turning it off, causing it to flash or blink at a particular rate, changing its color, etc. In some embodiments, each alarm includes an LED having a different color than the LEDs of other alarms. In this manner, a user can readily identify when a particular component is in need of service based on the color of the activated LED.

As an alternative, or in addition to, providing audible and/or visual alarms, a component status log can be generated and stored. The component status log can be accessed to retrieve historical data regarding the status of components of the power supply. Additionally, the alarm may include an alarm signal communicated between the power converter 200 and a host system of the power converter 200.

The processor 202 of FIG. 2 can be configured to monitor the health of components 204, 206, 208 using the method 100 of FIG. 1 or any other suitable method. Further, while the processor 202 shown in FIG. 2 is configured for monitoring the health of three components, it should be appreciated that more or less than three components can be monitored in any given implementation. Similarly, the number of alarms employed can be more or less than three, and may be as few as one. The processor 202 shown in FIG. 2 (and FIG. 3) may be a digital controller such as a microprocessor, a microcontroller, a microcomputer, a digital signal processor, etc. or any other suitable processing device. The processor 202 may be a dedicated processor or may be a processor that performs other, possibly unrelated, functions within the power supply. The processor 202 may be implemented using a combination of hardware, software and firmware. Alternatively, the processor 202 may be implemented using a hardwired analog and/or digital circuit.

Figure 3:
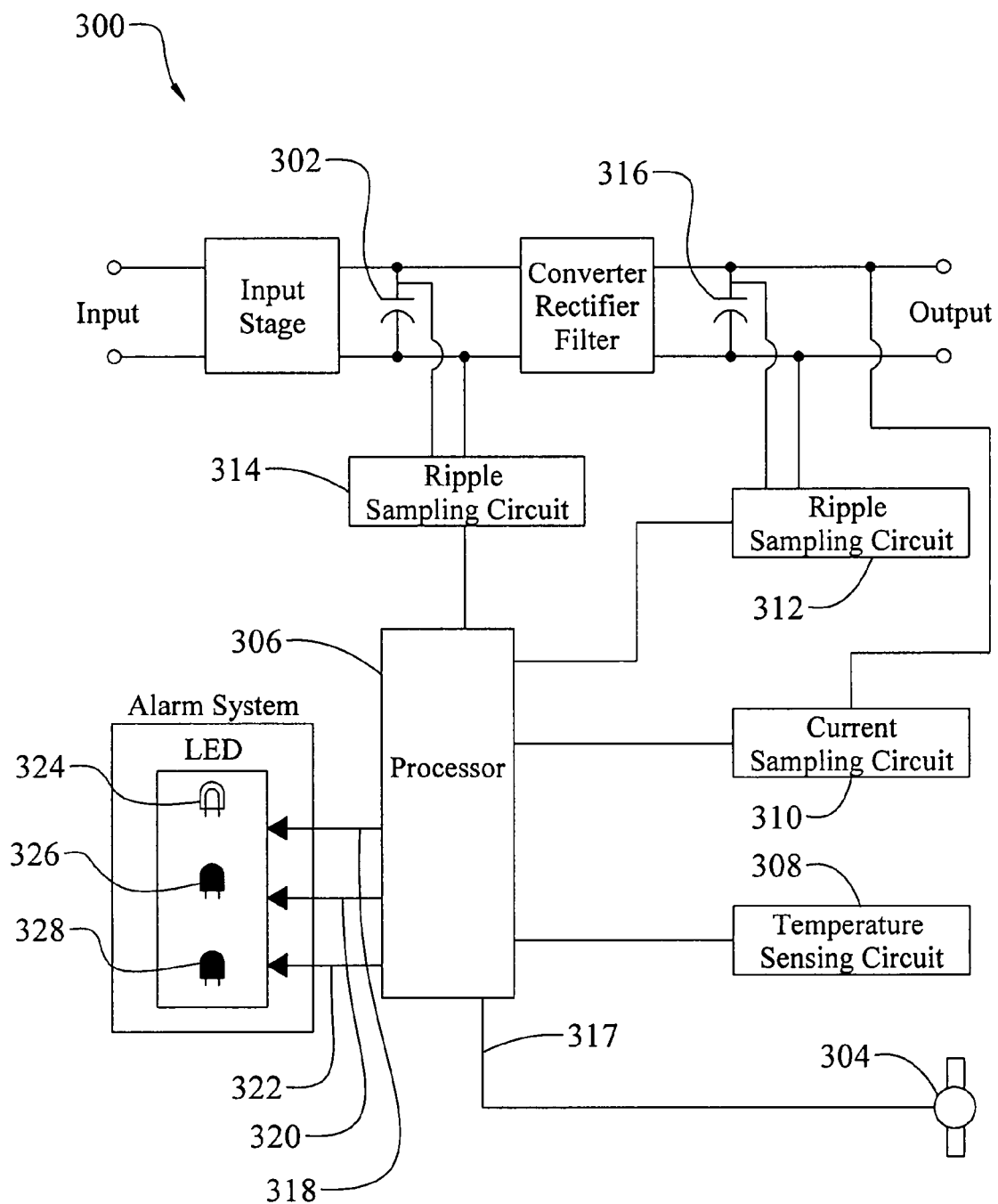
FIG. 3 is a block diagram of a power converter configured to monitor the health of a bulk capacitor, an output capacitor and a dc fan.

FIG. 3 illustrates a power converter 300 according to another embodiment of this disclosure. As shown in FIG. 3, the power converter 300 includes an electrolytic bulk capacitor 302, an electrolytic output capacitor 316, and a dc fan 304. The performance of these components will degrade over time. The power converter also includes a processor 306 for monitoring the health of the bulk capacitor 302, the output capacitor 316 and the fan 304 using the method 100 of FIG. 1. The power converter 300 may be configured as an AC/DC or DC/DC power converter. The power converter 300 can also include a power factor correction input stage (not shown).

More specifically, the processor 306 monitors the health of the bulk capacitor 302 and the output capacitor 316 by monitoring the ripple voltage across these devices and the output current level. For this purpose, the power converter 300 includes two ripple voltage sampling circuits 312 and 314 and an output current sampling circuit 310. The processor monitors the health of the dc fan 304 by monitoring the fan speed and the temperature of a heat sink (not shown) associated with the fan. For this purpose, the power converter includes a temperature sensing circuit 308 and the processor includes an input for monitoring a fan speed signal 317. These various circuits provide data to the processor 306. As further described below, this data is used by the processor to determine whether the health of any monitored component has degraded to a predetermined threshold level.

In the particular embodiment of FIG. 3, the processor 306 is configured to generate different warning signals 318, 320, 322 based on which component is in need of service. These warning signals are used to activate corresponding LEDs 324, 326, 328, with each LED having a different color. Once a particular LED is activated, a user can schedule appropriate service of the power converter before the component is completely damaged.

Figure 4:
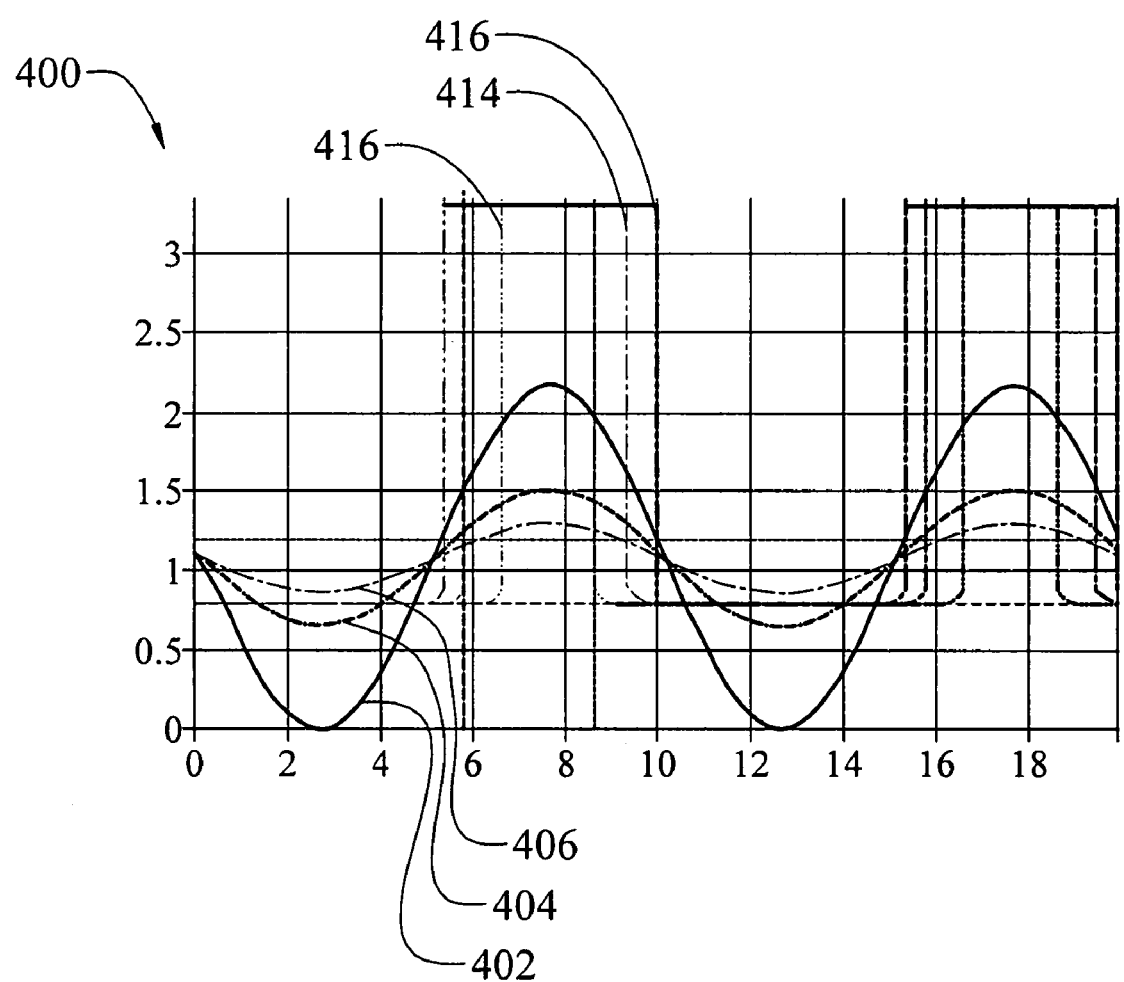
FIG. 4 is a is a graph relating ripple voltage to the duty cycle of a PWM signal.

In the particular embodiment of FIG. 3, the ripple voltage across the bulk capacitor is detected and converted to a pulse width modulated (PWM) signal having a duty cycle. The duty cycle of the PWM signal corresponds to the peak-to-peak magnitude of the detected ripple voltage. The greater the ripple voltage, the greater the duty cycle of the PWM signal. This relationship between the ripple voltage and the duty cycle of the PWM signal is illustrated in FIG. 4. As shown therein, the largest ripple voltage 402 corresponds to the PWM signal 412 with the largest duty cycle. A second and smaller ripple voltage 404 corresponds to a PWM signal 414 with a smaller duty cycle. The smallest ripple voltage 406 shown in FIG. 4 corresponds to the PWM signal 416 with the smallest duty cycle. In this manner, the processor 306 receives a PWM signal from the ripple sampling circuit 314 (preferably via an isolation device such as an optical coupler), with the duty cycle of the PWM signal representing the ripple voltage detected across the bulk capacitor 302.

By comparing the ripple voltage detected across the bulk capacitor 302, and comparing this information to stored data, the processor 306 can determine whether the health of the bulk capacitor has degraded to a threshold level indicating a need for service. In some embodiments, this threshold level is selected as a percentage (e.g., 20%) increase in the normal (initial) bulk capacitor ripple voltage. Thus, the processor 306 can be configured to generate the warning signal 318 (indicating a need to service the bulk capacitor) when the ripple voltage detected across the bulk capacitor 302 exceeds the initial bulk capacitor ripple voltage by more than twenty percent. Alternatively, ripple data associated with a former power supply failure can be stored and used in the detection criterion.

Figure 5:
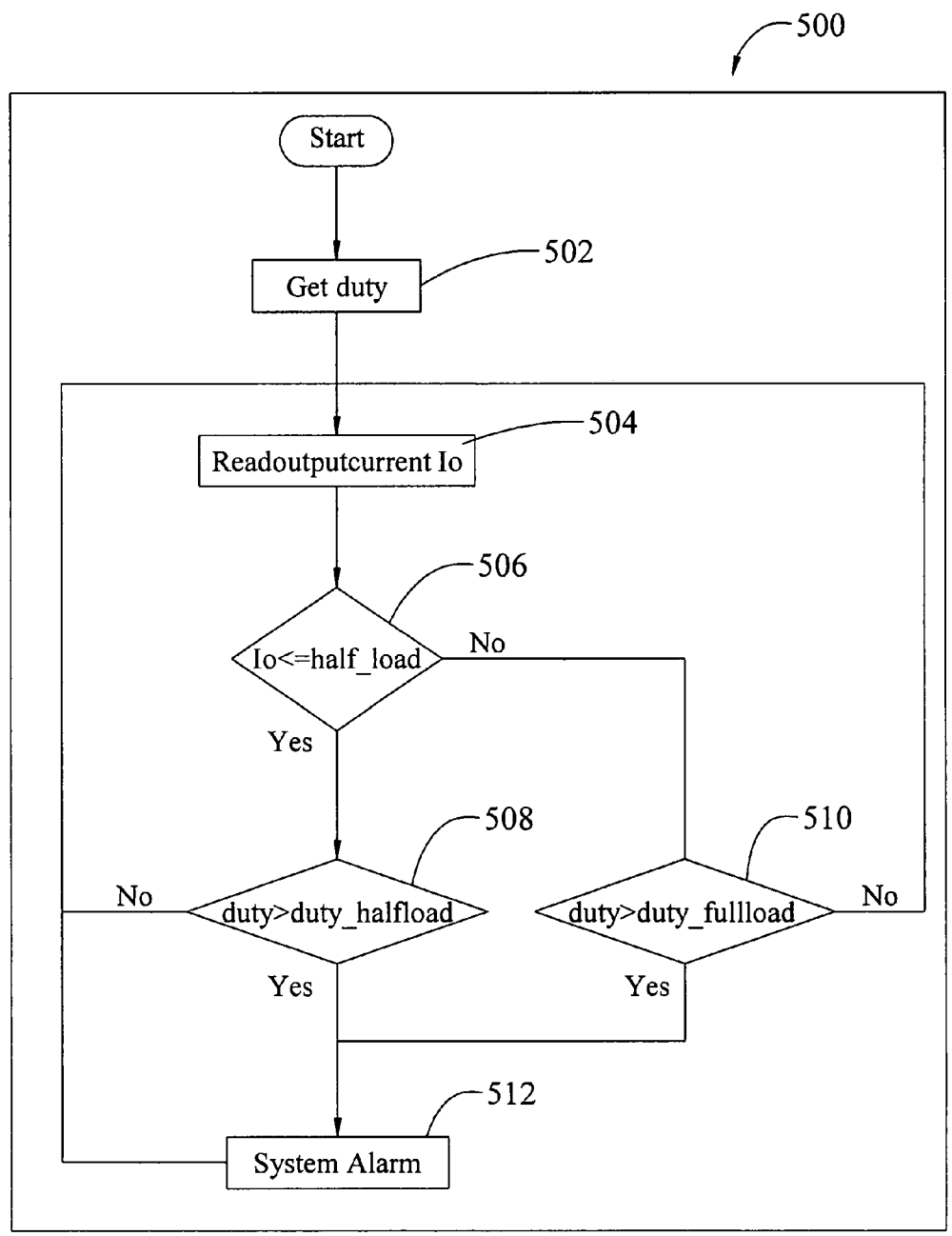
FIG. 5 is a flow diagram of a process for monitoring the health of a bulk capacitor in a power converter.

In some embodiments, the processor determines the health of the bulk capacitor 302 as a function of the ripple voltage across the bulk capacitor at a given output current level. One example of this is illustrated by the flow diagram of FIG. 5. At 502, the processor determines the duty cycle of the PWM signal generated by the bulk capacitor ripple voltage sampling circuit 314. At 504, the processor determines the output current level (as indicated by the current sampling circuit 310). At 506, the processor determines whether the output current is less than or equal to a current level corresponding to a half-load condition. If the current is less than or equal to the half load current, the processor determines, at 508, whether the duty cycle of the PWM signal (as provided by the ripple sampling circuit 314) is greater than a duty cycle corresponding to half-load condition. If so, the processor generates a warning signal at 512. Otherwise, processing loops back and repeats. If the processor determines at 506 that the output current is greater than the half-load condition, processing proceeds to 510 for determining whether the duty cycle of the PWM signal is greater than a duty cycle corresponding to a full load condition. If so, the processor generates a warning signal at 512. Otherwise, processing loops back and repeats. Although the method has been explained and illustrated with reference to only two load levels, it should be understood that the method can also be used with more than two load levels.

Figure 6:
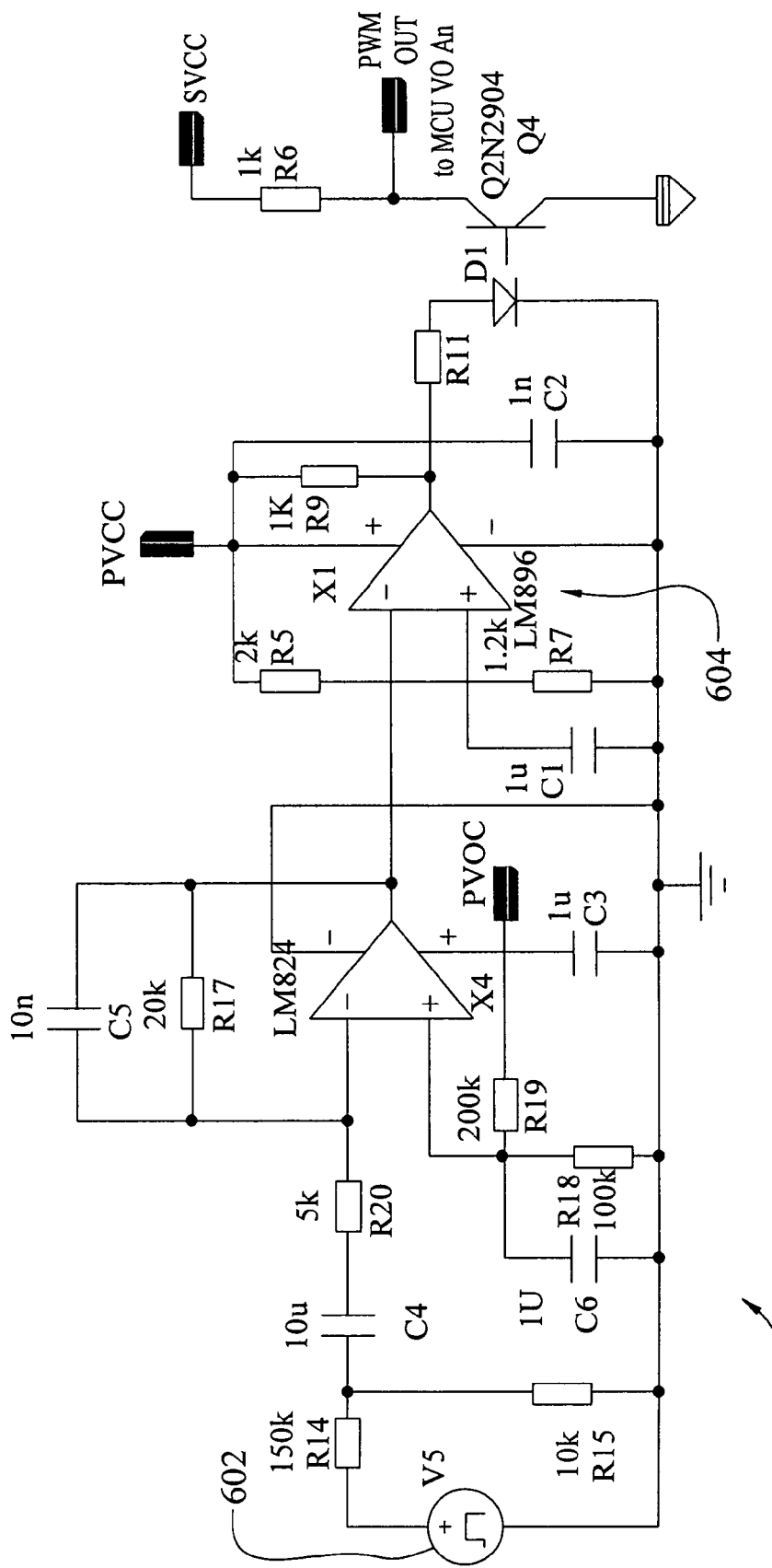
FIGS. 6 and 7 are schematic diagrams of sample bulk capacitor ripple voltage detection circuits.
Figure 7:
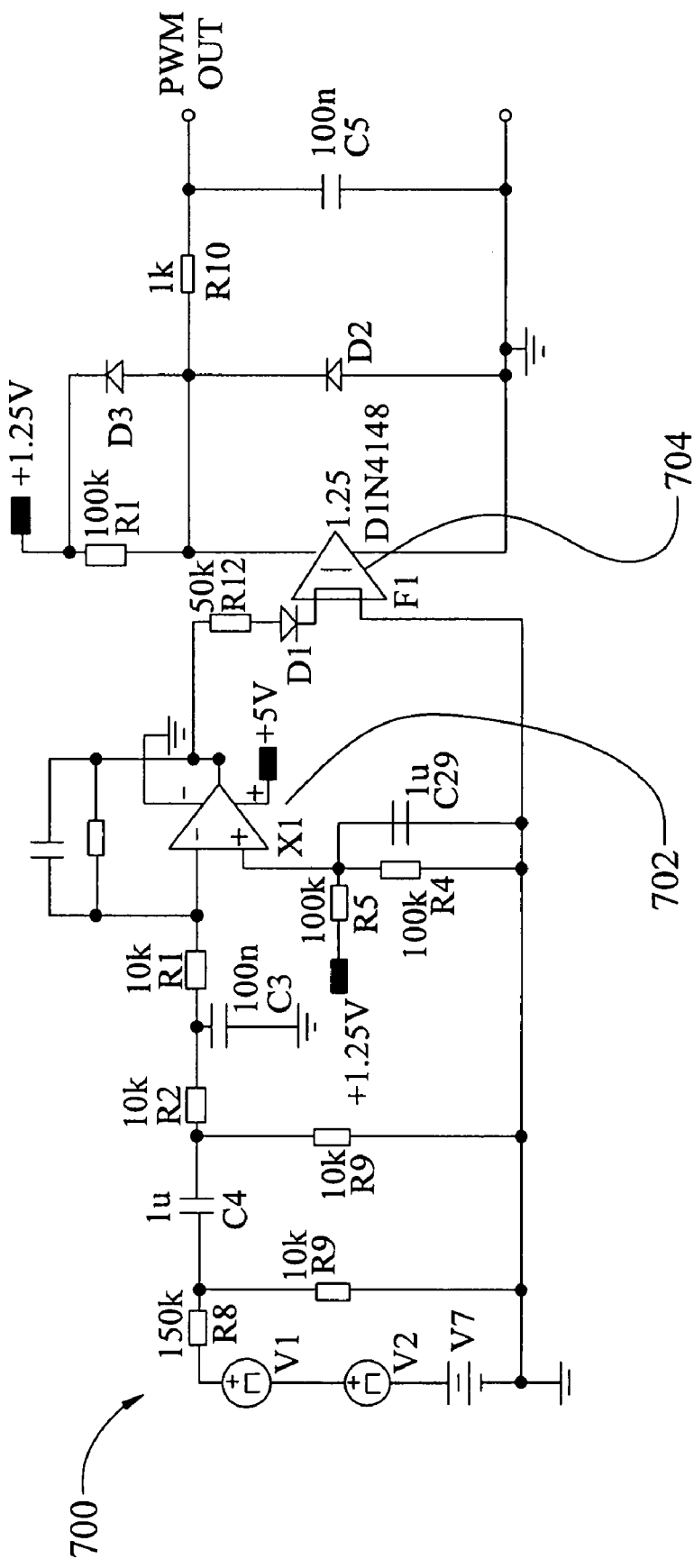

FIGS. 6 and 7 illustrate two examples of bulk capacitor ripple voltage sampling circuits 600, 700 suitable for use in the power converter of FIG. 3. As shown in FIG. 6, the ripple voltage across the bulk capacitor is provided to the circuit 600 as an input 602. A comparator 604 converts the input ripple voltage to a PWM signal having a duty cycle. In the circuit 700 of FIG. 7, a comparator 702 and an opto-coupler 704 are employed to achieve results similar to the circuit 600 of FIG. 6. It should be understood, however, that a variety of other circuits can be employed for detecting the ripple voltage across the bulk capacitor 302 without departing from the teachings of this disclosure.

With further reference to FIG. 3, the output capacitor ripple voltage sampling circuit 312 provides a signal to the processor 306 representing the ripple voltage across the output capacitor 316. In the particular embodiment of FIG. 3, this signal provided to the processor represents a peak value of the output capacitor ripple voltage. Alternatively, other signals can be used so long as there is a known relationship between the ripple magnitude and the signal format.

In some embodiments, a ripple voltage signal passes through a peak value detection circuit before being input to the processor 306. Power converter secondary side ripple voltage often has a frequency approximately equivalent to a switching frequency of the power converter or an integer multiple of the switching frequency. Switching frequency is, in many instances, greater than 100 kHz and may increase in the future. Thus the frequency of the ripple voltage is often well in excess of 100 kHz. Computational processing of AC signals at several hundred kHz can be complex and expensive. The complexity and expense can be reduced by converting the ripple voltage AC signal to a DC voltage. A variety of AC to DC conversion techniques can be used to accomplish this conversion with various degrees of accuracy and complexity. One example circuit that may be used for this purpose is a peak value detection holding circuit.

By comparing the ripple voltage detected across the output capacitor 316 with stored data, the processor 306 can determine whether the health of the output capacitor 316 has degraded to a threshold level indicating a need for service. In some embodiments, this threshold level is selected as a percentage (e.g., 90%) of the maximum rated output ripple voltage. Thus, the processor 306 can be configured to generate the warning signal 320 when, e.g., the ripple voltage detected across the output capacitor 316 is greater than or equal to ninety percent of the maximum rated output ripple voltage.

Figure 8:
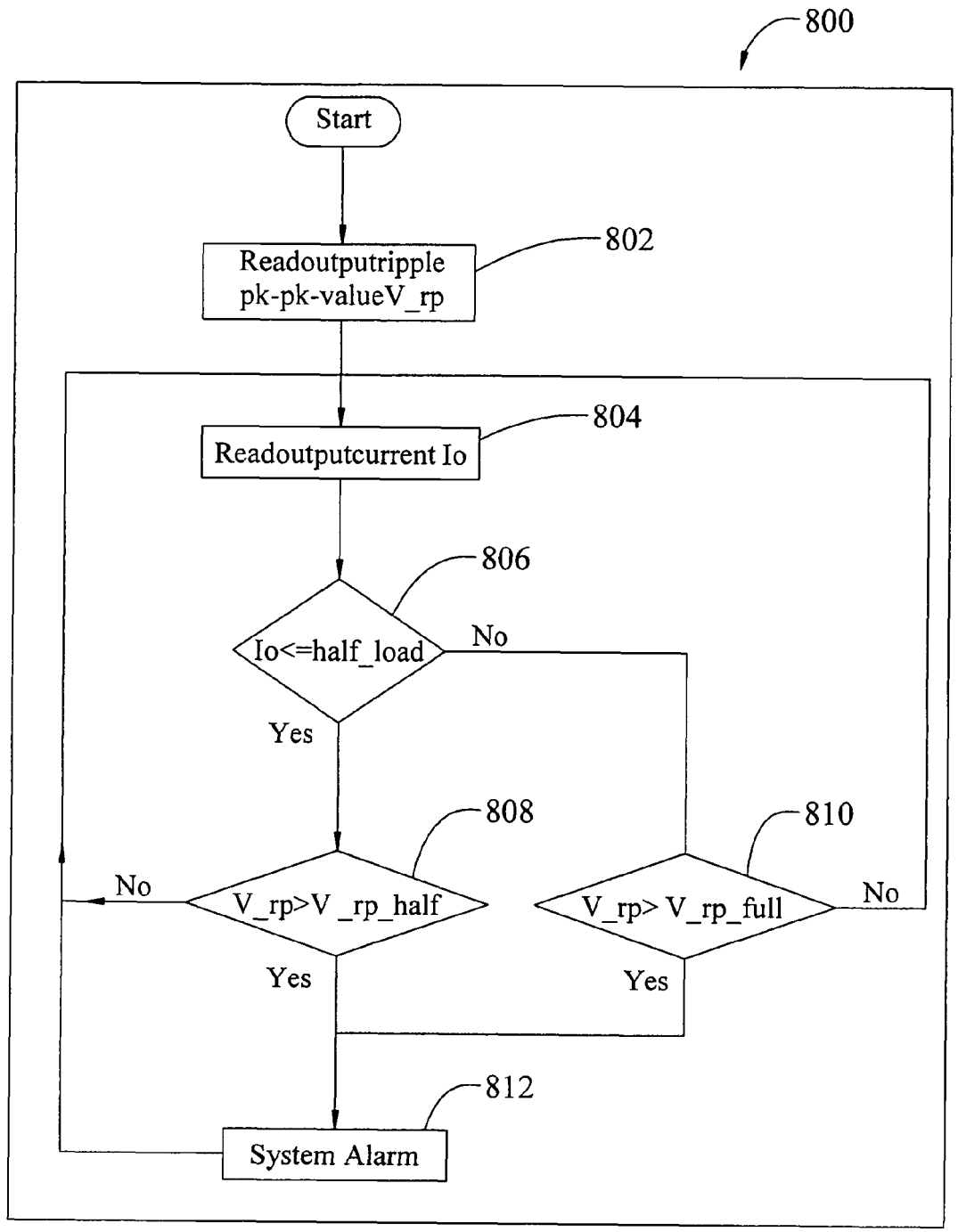
FIG. 8 is a flow diagram of a process for monitoring the health of an output capacitor in a power converter.

In some embodiments, the processor 306 determines the health of the output capacitor 316 as a function of the ripple voltage across the output capacitor 316 at a given output current level. One example of this is illustrated by the flow diagram of FIG. 8. At 802, the processor determines the value of the ripple voltage detected by the ripple sampling circuit 312. At 804, the processor determines the output current level as detected by the current sampling circuit 310. The processor then determines, at 806, whether the output current level is less than a current level corresponding to a half-load condition. If the current is less than or equal to the half load current, the process continues to 808. At 808, the processor determines whether the ripple voltage is larger than the ripple voltage expected for a half load condition. If so, processing continues to 812 and a warning signal is generated. Otherwise, the process loops and repeats. If the processor determines at 806 that the output current is greater than the half load current, the processor will proceed to 810 to determine whether the ripple voltage is greater than what is expected for a full load condition. If so, processing continues to 812 and a warning signal is generated. Otherwise, the process loops and repeats.

Figure 9:
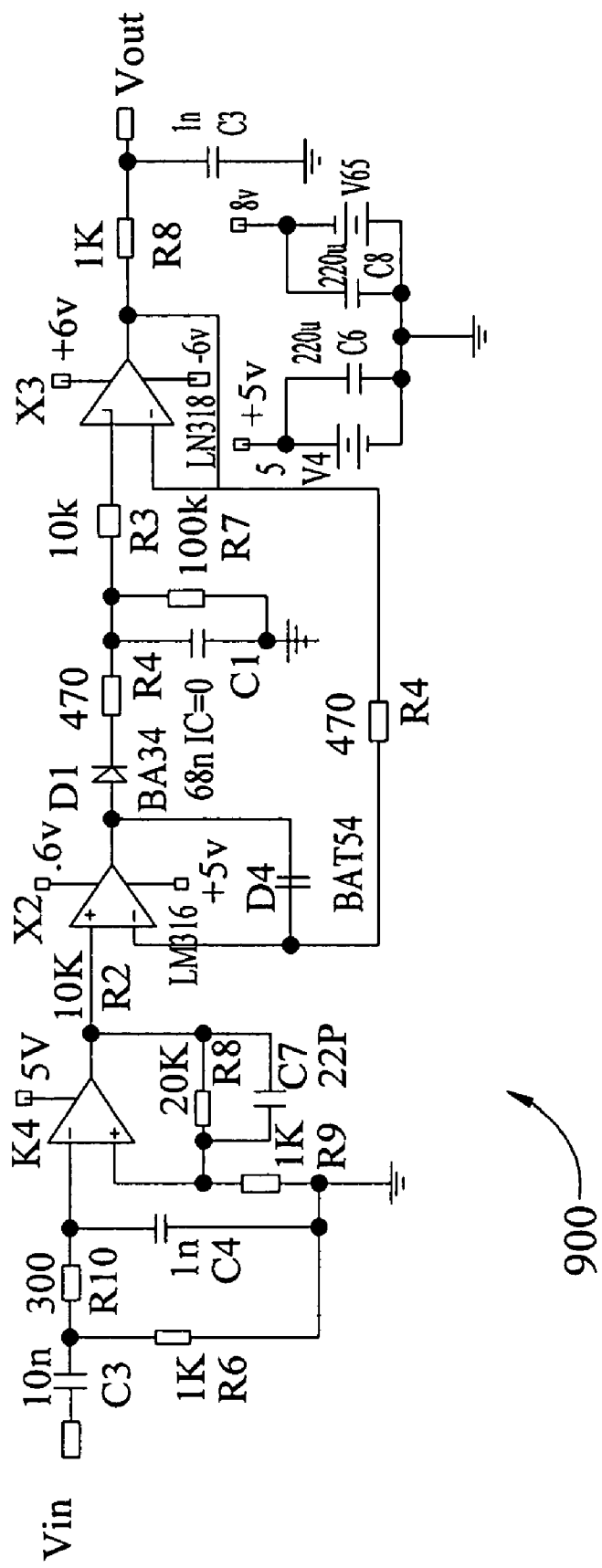
FIG. 9 is a schematic diagram of an output capacitor ripple voltage detection circuit.

FIG. 9 illustrates an output capacitor ripple voltage sampling circuit 900 suitable for use in the power converter of FIG. 3. As shown in FIG. 9, the output capacitor ripple voltage is provided as an input Vin. The amplitude of the ripple voltage is amplified and then filtered with a bandpass filter to remove low frequency ripple (e.g., below half of a switching frequency of the power converter) and high frequency ripple (e.g., above 500 kHz) noise at the front end of the operational amplifier X3. The operational amplifier is preferably high speed so as to attain high gain and linearity. The forward voltage drop of the diode D1 is compensated by the op amp X2 for performance changes due to temperature variation. The resistor paralleled with the capacitor ensures discharge of the capacitor. Therefore, when the amplitude of the input ripple voltage changes, the signal is amplified. The circuit 900 converts the output capacitor ripple voltage to an DC signal representing the peak value of the ripple voltage. If the ripple voltage is a sine wave signal, the DC signal output from the circuit 900 may represent the RMS value of the ripple voltage.

As noted above, the processor 306 of FIG. 3 is configured to monitor the health of the dc fan 304 by monitoring the fan speed and the temperature of an associated heat sink. In general, there is a minimum desired fan speed for a given temperature. Therefore, if the fan speed is less than a predetermined threshold value at a given temperature, this may be indicative of an impending fan failure and can be used to generate an appropriate warning signal.

Figure 10:
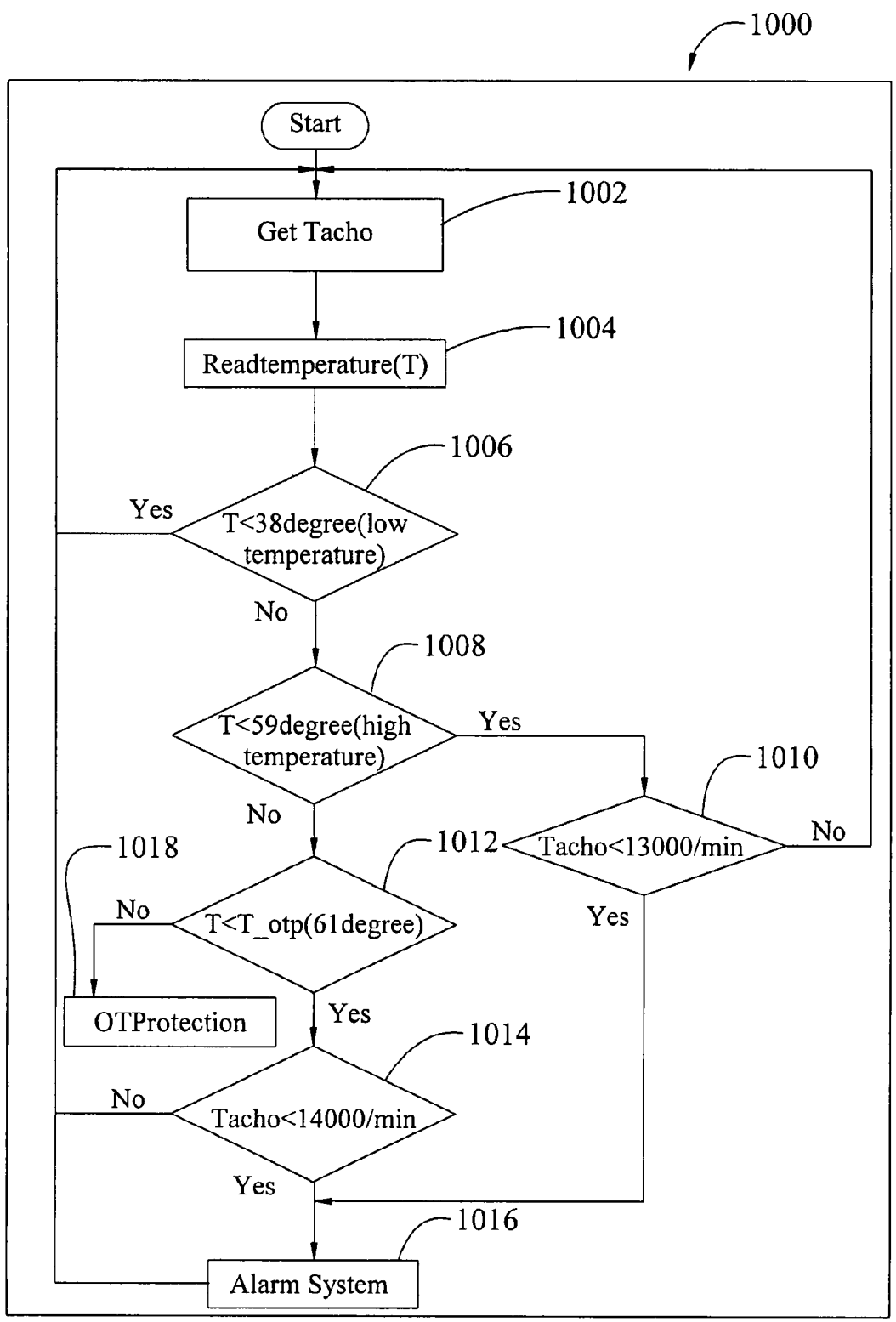
FIG. 10 is a flow diagram of a process for monitoring the health of a dc fan in a power converter.

One example of a process for detecting a performance degradation of the dc fan is illustrated in FIG. 10. As shown therein, the process begins with determining the speed of the fan at 1002 and the temperature of an associated heat sink at 1004. At 1006, the process determines whether the temperature is less than a lower limit which, in this particular example, is 38 degrees Celsius. If so, the process loops and repeats. Otherwise, the process determines at 1008 whether the temperature is below a higher limit which, in this particular example, is 59 degrees Celsius. If so, the process continues to determine at 1010 whether the fan speed is less than a minimum expected speed for temperatures below 59 degrees Celsius. If not, the process loops and repeats. Otherwise, the fan is not operating as it should and processing continues to 1016 and generates a warning signal. If processing determines at 1008 that the temperature is above the high temperature, processing continues to 1012 to determine whether the temperature has exceeded an over-temperature protection value which, in this example, is 61 degrees Celsius. If so, processing continues to 1018 where over temperature protection is initiated. Otherwise, processing continues to 1014 to determine whether the fan speed is less than a minimum expected speed for temperatures approaching 61 degrees Celsius which, in this particular example, is 14,000 rpm. If so, processing continues to 1016 and a warning signal is generated. Otherwise, processing loops and repeats. Alternatively, the processor 306 can be configured to detect performance degradations in the fan by monitoring the fan speed at a given applied voltage and/or airflow impedance. Although two temperature levels are illustrated in this particular example, implementation of this process is not so limited and any number of temperature levels of varying magnitudes may be used.

Figure 11:
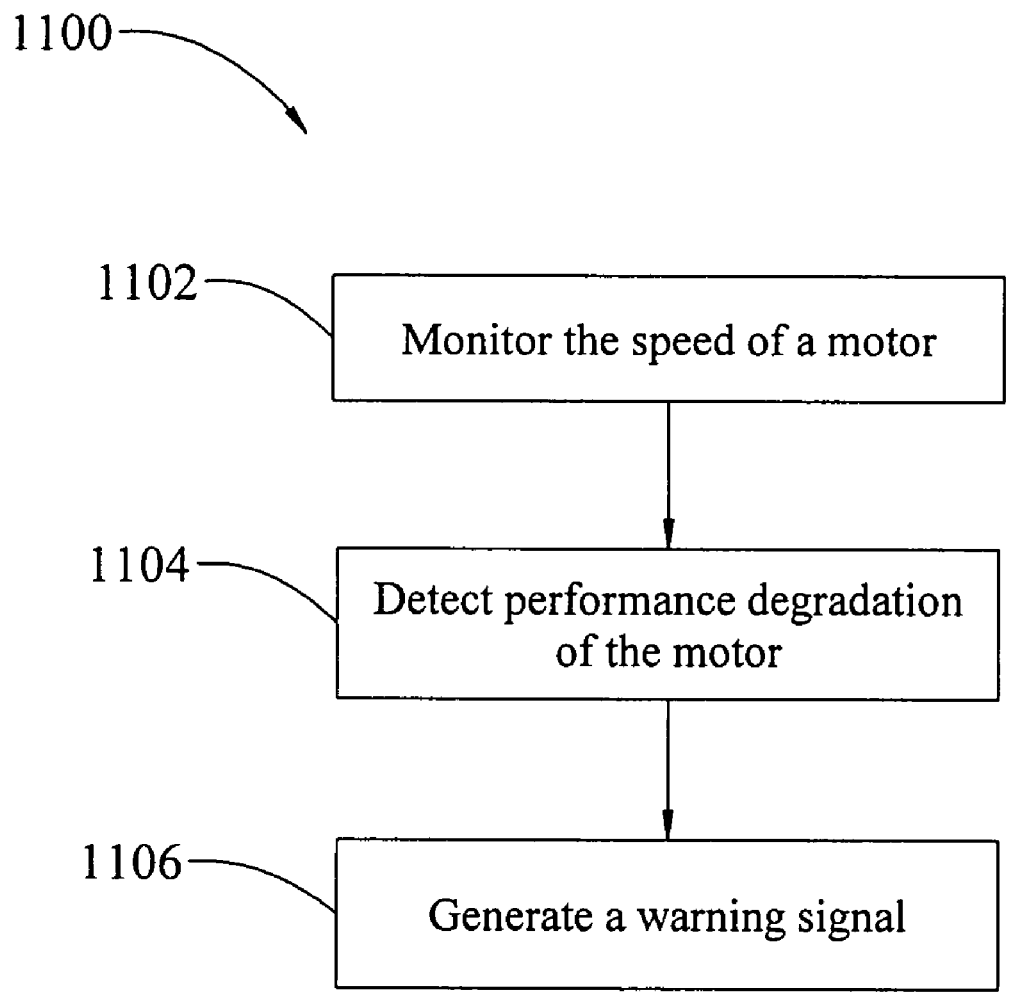
FIG. 11 is a flow diagram of a process for monitoring the health of an electric motor.

FIG. 11 illustrates a method of detecting performance degradations in an electric motor according to another aspect of the present disclosure. As shown in FIG. 11, the method includes, at 1102, monitoring the speed of the motor. At 1104, a performance degradation of the motor is detected. At 1106, a warning signal is generated. The method may also include monitoring control signals provided to the electric motor, including the applied voltage or duty cycle. In this manner, the performance degradation of the motor may be determined based, at least in part, on the monitored speed of the motor and the control signals provided to the motor. In particular, if the monitored speed of the motor does not coincide with the control signals provided to the motor, this may be indicative of an impending motor failure or other need for servicing the motor. In response to the warning signal, the motor can be serviced as necessary or replaced. The electric motor may be part of a larger system or assembly, including for example a power converter fan.

Figure 12:
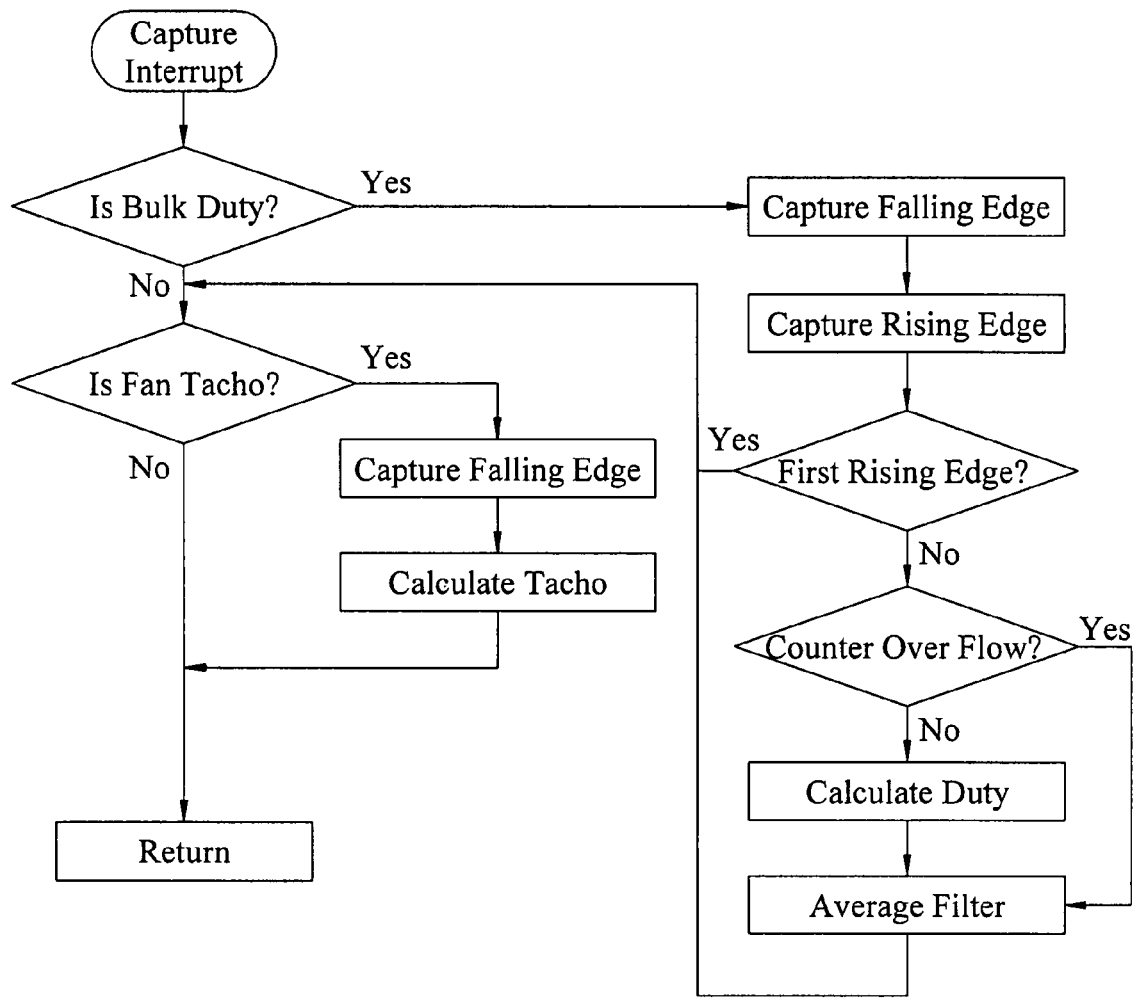
FIG. 12 is a flow diagram of a capture interrupt service process performed by the processor shown in FIG. 3.

FIG. 12 illustrates a capture interrupt service process performed by the processor of FIG. 3 to determine the speed of the fan and the duty cycle of the PWM signal associated the bulk capacitor ripple voltage. As shown in FIG. 12, these two operating characteristics are captured independently using a two capture port. The duty cycle is preferably captured by measuring the time difference between a rising edge and a falling edge and the time difference between the falling edge and a subsequent rising edge of the PWM signal associated with the bulk capacitor ripple voltage. Fan speed is preferably captured by measuring the time interval between successive rising or successive falling edges of a fan tachometer signal.

Also shown in FIG. 12 is a single average filter block for providing improved alarm reliability by removing or reducing signal jitter. The single average filter block achieves this objective using a rolling average method. Specifically, an average of a predetermined number of measurements is calculated. When a new measurement is available, the oldest measurement is discarded and the new value becomes a component of the average.

It should be noted that the processors 202, 306 shown in FIGS. 2 and 3 may be included on the same board or package as other power converter components, and may perform processes in addition to those described herein (including, for example, control processes for a switch-mode power supply). Alternatively, the processors may be located apart from other components including, for example, in a system hosting the power converter (e.g., a computer server).

Although several aspects of the present disclosure have been described above with reference to power converters, it should be understood that various aspects of the present disclosure are not limited to power converters and can be applied to a variety of systems and applications including, without limitation, electric motors, automotive systems, and other types of electronic or electromechanical systems used in automotive, motor control, or other industries.

By implementing any or all of the teachings described above, a number of benefits and advantages can be obtained including improved system reliability, reduced system down time and elimination and reduction of redundant components or systems, avoiding unnecessary or premature replacement of components or systems, and a reduction in overall system and operating costs.

The invention claimed is:

1. A power converter comprising a processor, a first component whose health in the power converter will degrade over time, a second component whose health in the power converter will degrade over time, a first alarm, and a second alarm, the processor configured for monitoring the health of the first component over time and activating the first alarm when the monitored health of the first component reaches a first threshold level, and for monitoring the health of the second component over time and for activating the second alarm when the monitored health of the second component reaches a second threshold level.

2. The power converter of claim 1 wherein the processor is configured for monitoring the health of the first component by monitoring at least one performance characteristic of the power converter that represents the health of the first component, and wherein the processor is configured for monitoring the health of the second component by monitoring at least one performance characteristic of the power converter that represents the health of the second component.

3. The power converter of claim 2 wherein the power converter is configured for activating the first alarm only when the monitored health of the first component reaches the first threshold level, and wherein the processor is configured for activating the second alarm only when the monitored health of the second component reaches the second threshold level.

4. The power converter of claim 3 wherein at least one of the first alarm and the second alarm is a visual alarm.

5. The power converter of claim 4 wherein the visual alarm includes an LED.

6. The power converter of claim 3 wherein at least one of the first alarm and the second alarm is an audible alarm.

7. The power converter of claim 3 wherein the first component is a capacitor.

8. The power converter of claim 7 wherein the at least one performance characteristic of the power converter that represents the health of the capacitor includes a ripple voltage across the capacitor and wherein the processor is configured for activating the first alarm when the monitored ripple voltage reaches a predetermined threshold level.

9. The power converter of claim 8 wherein the second component is a fan.

10. The power converter of claim 9 wherein the at least one performance characteristic of the power converter that represents the health of the fan includes a control signal provided to the fan and a speed of the fan, and wherein the processor is configured for activating the second alarm when the monitored speed of the fan is less than a fan speed corresponding to said control signal.

11. The power converter of claim 9 wherein the at least one performance characteristic of the power converter that represents the health of the fan includes a speed of the fan and a temperature, and wherein the processor is configured for activating the second alarm when the monitored speed of the fan is less than a predetermined fan speed corresponding to said temperature.

12. The power converter of claim 3 wherein the power converter comprises a third component whose performance in the power converter will degrade over time, and a third alarm, the processor configured for monitoring the health of the third component over time and activating the third alarm when the monitored health of the third component reaches a third threshold level.

13. The power converter of claim 12 wherein the first, second and third alarms each include an LED.

14. The power converter of claim 13 wherein each LED has a different color.

15. The power converter of claim 13 wherein the first component is a bulk capacitor, the second component is an output capacitor and the third component is a fan.

16. The power converter of claim 3 wherein the first alarm and the second alarm are audible alarms.

17. The power converter of claim 3 wherein the first alarm and the second alarm are visual alarms.

18. The power converter of claim 1 wherein at least one of the first alarm and the second alarm is an audible alarm.

19. The power converter of claim 1 wherein the first alarm and the second alarm are audible alarms.

20. The power converter of claim 1 wherein at least one of the first alarm and the second alarm is a visual alarm.

21. The power converter of claim 1 wherein the first alarm and the second alarm are visual alarms.

\* \* \* \* \*